Oct. 16, 1956 Z. K. HASS 2,767,378

FREQUENCY MODULATION RELAXATION OSCILLATOR

Filed Dec. 15, 1952 4 Sheets-Sheet 1

INVENTOR
ZYGMUNT KONSTANTY HASS
BY Bailey, Stephens & Huettig
ATTORNEYS

FIG. 3 - LINEAR FREQUENCY MODULATION
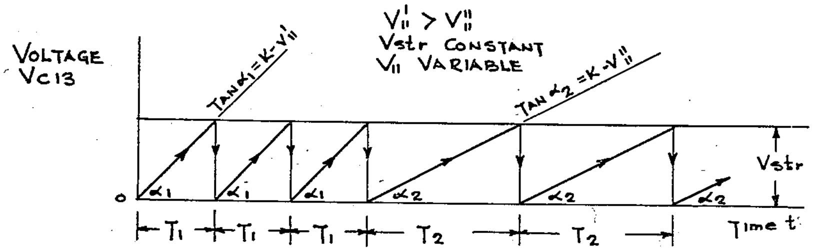
FIG. 4 - LINEAR PERIOD MODULATION
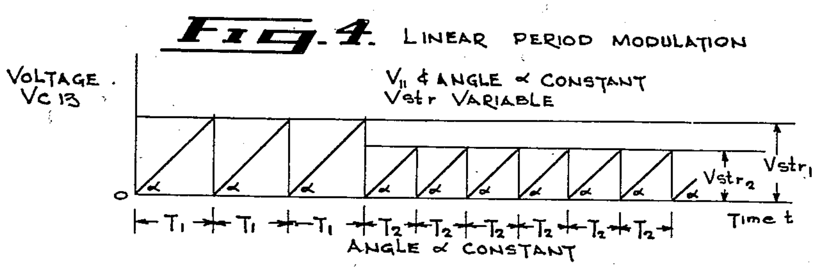
FIG. 5 - EXPONENTIAL FREQUENCY MODULATION
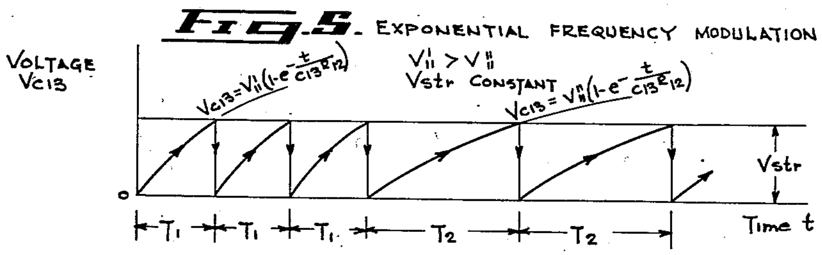
FIG. 6 - EXPONENTIAL PERIOD MODULATION
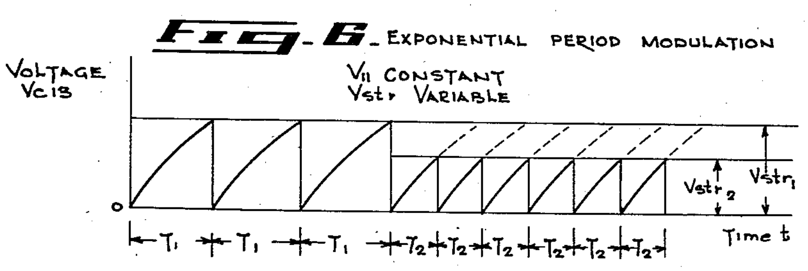
INVENTOR
ZYGMUNT KONSTANTY HASS
BY
Bailey, Stephens & Huettig
ATTORNEYS Oct. 16, 1956 Z. K. HASS 2,767,378

FREQUENCY MODULATION RELAXATION OSCILLATOR

Filed Dec. 15, 1952 4 Sheets-Sheet 3

INVENTOR
ZYGMUNT KONSTANTY HASS

BY

Bailey, Stephens & Huettig

ATTORNEYS

INVENTORS
ZYGMUNT KONSTANTY HASS
BY
Bailey, Stephens & Huettig
ATTORNEYS

United States Patent Office 2,767,378
Patented Oct. 16, 1956

2,767,378

FREQUENCY MODULATION RELAXATION OSCILLATOR

Zygmunt Konstanty Hass, Ottawa, Ontario, Canada, assignor to Her Majesty the Queen in the Right of Canada as represented by the Minister of National Defence, Ottawa, Ontario, Canada Application December 15, 1952, Serial No. 326,007

Claims priority, application Canada July 10, 1952

3 Claims. (Cl. 332—14)

This invention relates to a relaxation oscillator which is particularly suitable for the generation of frequency modulated oscillations.

It is an object of my invention to provide an oscillator suitable for frequency modulated communication systems where high fidelity transmission is required. One example of such a system is a carrier telephony communication system where the channel carriers are superimposed on a new frequency modulated sub-carrier, for the purpose of transmission over open wire lines, cables or radio links.

It is an object of my invention to provide a relaxation oscillator which allows linear frequency modulation over a wide frequency band.

It is an object of my invention to provide a relaxation oscillator which will perform with the linearity described above up to high frequencies.

It is an object of my invention to provide a relaxation oscillator wherein the frequency deviation of the output signal is related to the modulating signal by a mathematic law, and where this mathematical relationship may be linear, hyperbolic, exponential or logarithmic.

It is an object of my invention to provide a relaxation oscillator which will produce a high frequency saw tooth signal which is applicable to control the sweep of a cathode ray oscillograph.

There is herein provided a relaxation oscillator wherein each electron tube performs a single function only. This arrangement reduces the effect of lack of linearity of tube response and tube variations in general on the output signal. Moreover, a circuit is provided whereby the oscillation and modulation is achieved without recourse to a resonant circuit, since such a circuit is fundamentally lacking in linearity. These factors provide a circuit which is free from random and non-linear frequency variation and permits modulation in accordance with a mathematical law.

Figures 3, 4, 5 and 6 show the oscillator wave forms developed with various types of modulation conditions in the oscillator.

Figure 1:
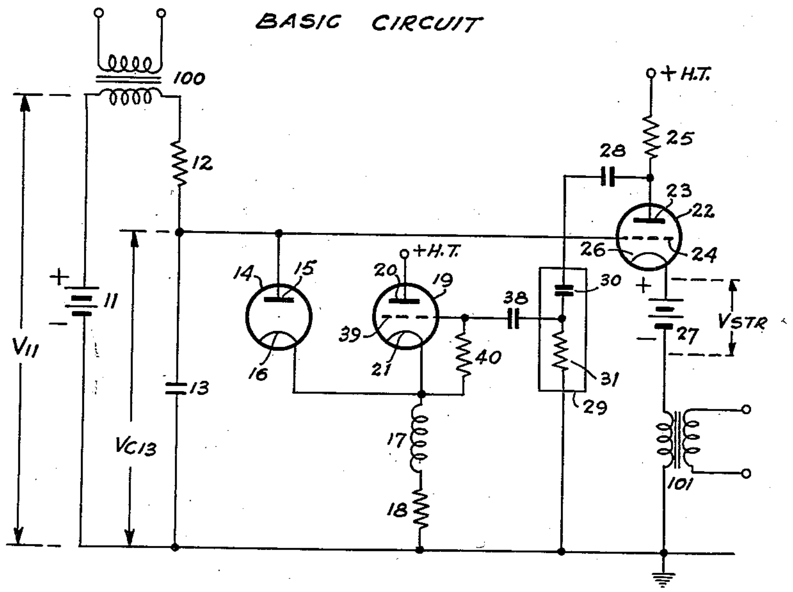
Figure 1 shows a simple circuit based on my invention.

Referring now to Figure 1, a high tension source 11 with its negative side grounded is connected in series with a resistor 12 and a condenser 13 with the side of the condenser opposite from the resistor also grounded.

The anode 15 of a diode 14 is connected between the junction of resistor 12 and condenser 13. The cathode

16 of the diode 14 is grounded through an inductor 17 and resistor 18 in series. Inductor 17 and resistor 18 supply a common ground for cathode 16 and for cathode 21 of a tube 19 whose anode 20 is connected to a positive high tension source (not shown). This tube is normally conducting, thus rendering the diode 14 non-conducting.

(NOTE.—In the following text, the word "triode" represents any multi-electrode electronic tube such as a tetrode, pentode, etc.)

The anode 15 of diode 14 is also connected to the control grid 24 of a triode 22. The anode 23 of this triode is connected to a positive high tension source through a resistor 25 while the cathode 26 is positively biased relative to ground by a battery 27, which biases tube 22 beyond cut off. The plate 23 of tube 22 is connected through an isolating condenser 28 to the differentiating circuit 29 composed of a condenser 30 and a resistor 31.

The tube 19 has its grid 39 connected to the junction of resistor 31 and condenser 30.

Also shown are modulation transformers 100 and 101. In most cases they would not be used concurrently but one of the two would be selected and the other would be omitted from the circuit. The use and selection of these transformers will be discussed hereinafter.

The operation of the circuit shown in Figure 1 will now be discussed:

The condenser 13 is charged through the resistor 12 from the high tension source 11. The positive charge on the condenser acts to raise the potential of grid 24. As the condenser 13 charges, the potential of grid 24 eventually rises to a value which overcomes the bias on cathode 26, and triode 22 begins conducting.

The conduction in tube 22 causes a drop in the potential of anode 23 which produces a negative transient pulse which is passed through isolating condenser 28 to differentiating circuit 29. The differentiated pulse is then applied to the grid 39 of the cathode follower tube 19. The triode 19 which is normally conducting is cut off by the negative differentiated pulse, causing a drop in its cathode potential and consequently in that of the cathode 16 of diode 14.

The drop in potential of cathode 16 causes the diode 14 to conduct and the consequent discharge of the condenser 13 through it.

The coil 17 reduces the time between the arrival of the pulse at the grid of triode 19 and the discharge of condenser 13.

When condenser 13 has been discharged the potential of the grid 24 has again fallen below the cut-off value and the tube 22 becomes non-conducting again. The consequent rise in voltage of anode 23 provides the positive bias for cathode 16 of diode 14 and stops discharge of the condenser 13, and restores the circuit to its initial operating condition.

The above describes one cycle of operation of the circuit shown in Figure 1. The voltage wave forms developed across condenser 13 and at the plate of triode 22 are shown in Figures 7($a$) and 7($b$) respectively where time is the abscissa on both curves.

Figure 7:
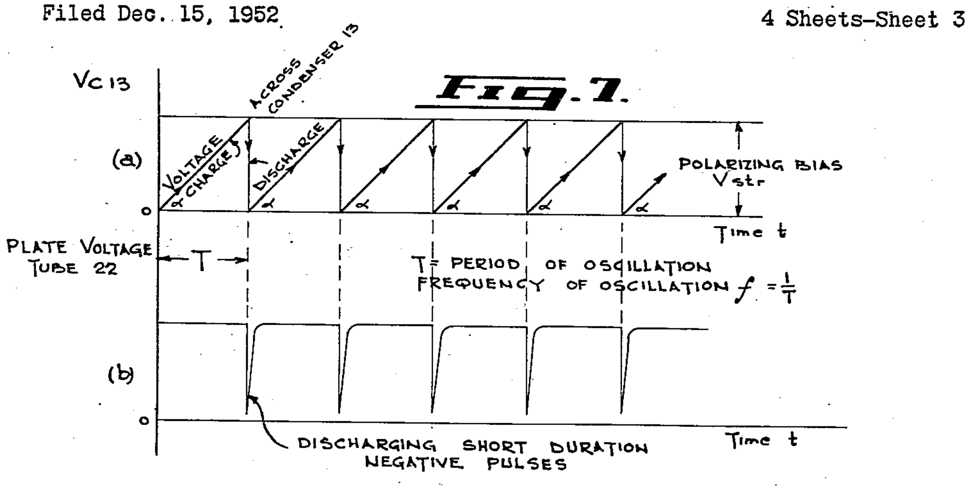
Figure 7 shows various wave forms developed in the circuit as shown in Figure 1.

That portion of Figure 7($a$) with the positive slope denotes the charging of the condenser 13. The portion with the negative slope denotes the discharging of the condenser 13.

The time taken to charge the condenser 13 in this and subsequent circuits will be referred to as the "charging time" while the time to discharge the condenser will be referred to as the "flyback time." In the circuit as previously described, and in those to be described hereafter the "flyback time" is very small relative to the "charging time."

The application of modulating voltage to the circuit will be discussed with reference to Figure 7(*a*). It is assumed that the "flyback time" is negligible relative to the charging time and may be forgotten in mathematical calculations. It will be seen that with this assumption and the described circuit the frequency deviation is related to the modulating signal by a mathematical law (which may be linear, hyperbolic or exponential). The error inherent in the results depends on the length of the "flyback time." The "flyback time" in the above circuit is sufficiently small to give good results. Hereinafter circuits will be described where this time is further reduced.

The various types of possible modulation processes are shown graphically in Figures 3–6 inclusive.

Referring to Figures 7(*a*) and 3, the upper limit of the saw-tooth voltage is set by the voltage of battery 27 which controls the striking voltage of triode 22. The slope of the charging cycle portion is set by the voltage of source 11 and also the time constant of condenser 13 and resistor 12. Further, if source 11 is large relative to the discharge voltage of condenser 13, the positive slope may be considered a straight line. For the purposes of the following discussion this condition is assumed, and when linear or hyperbolic modulation is desired the circuit will be so designed.

*Linear frequency modulation*

With the source 27 and the remaining elements of the circuit constant, it will be noted that the slope of the positive slope portion (i. e. the rate of charge of condenser 13) varies linearly with the magnitude of source 11 and that the oscillator frequency varies similarly.

Thus if a modulating signal is applied to modulating transformer 100 it effectively alters the magnitude of source 11 and hence the frequency of the oscillator. From the discussion above it will be seen that the frequency deviation is proportional to the modulating signal amplitude and that linear frequency modulation is thus provided. (See Figure 3.)

*Linear period modulation*

A second type of modulation is provided by applying the modulating signal to modulating transformer 101 instead of transformer 100. It will be seen that the bias on cathode 26 varies linearly with the magnitude of source 27. The striking potential at which grid 24 overcomes this bias thus also varies linearly with source 27.

It will be seen by reference again to Figure 4 that with the source 11 and the remainder of the circuit elements constant, the period of the oscillator will vary linearly with the magnitude of the signal applied to transformer 101.

Linear frequency and linear period modulations may be combined to further improve the linearity of the selected modulation, by applying partial (or fractional) modulation to the appropriate transformer in Figures 1, 2, 9 and 10.

To achieve very linear frequency modulation, the full modulating signal is applied to transformer 100, whereas a correcting partial signal of suitable magnitude and phase is applied to transformer 101. This correcting partial signal is derived from the full modulating signal.

To achieve very linear period modulation, the full modulating signal is applied to transformer 101 whereas the correcting partial signal of suitable magnitude and phase is applied to transformer 100. This correcting partial signal is derived from the full modulating signal. NOTE.—In linear period modulation, the saw-tooth voltage across condenser 13 may be integrated. The integrated area under the saw-tooth varies with the modulating frequency. It is possible to utilize this resultant (integrated) voltage for checking the modulating process or for negative feedback. When this negative feedback is applied the linearity of the period modulation is improved.

Two other types of modulation are obtainable when the circuit is designed so that the amplitude of the saw-tooth voltage is of the same order of magnitude as the voltage of source 11. The positive slope portion of the curve can no longer be assumed to be a straight line but must be treated as the exponential curve for a charging condenser and is represented by the equation:

$$V_{C13}=V_{11}\left(1-e^{-\frac{t}{R_{12}C_{13}}}\right)$$

where $V_{C13}$=voltage across condenser 13
$V_{11}$=voltage of source 11
$R_{12}$=resistance of resistor 12
$C_{13}$=capacitance of condenser 13
$t$=time measured from the beginning of the positive slope portion of a cycle When $V_{C13}$=the striking voltage $V_{STR}$, $t=T$ and the equation is of the form:

$$V_{STR}=V_{11}\left(1-e^{-\frac{T}{R_{12}C_{13}}}\right)$$

$$\frac{V_{STR}}{V_{11}}=\left(1-e^{-\frac{T}{R_{12}C_{13}}}\right)=1e^{-\frac{\frac{1}{T}}{R_{12}C_{13}}}$$

$$e^{\frac{\frac{1}{T}}{R_{12}C_{13}}}=1^{-\frac{V_{STR}}{V_{11}}}$$

$$e^{\frac{T}{R_{12}C_{13}}}=\frac{1}{1-\frac{V_{STR}}{V_{11}}}$$

$$\frac{T}{R_{12}C_{13}}=ln\left(\frac{1}{1-\frac{V_{STR}}{V_{11}}}\right)$$

$$T=R_{12}C_{13}ln\left(\frac{1}{1-\frac{V_{STR}}{V_{11}}}\right)$$

Hence variation of either $V_{STR}$ or $V_{11}$ will produce modulation of the period "T."

Therefore application of a modulation voltage at transformer 101 to linearly vary the value of the discharge voltage $V_{STR}$ will vary the period T logarithmically (Exponential period modulation—see Figure 6).

Similarly an application of a modulating voltage to modulation transformer 100 will effectively vary the value of $V_{11}$ and produce inverse logarithmic variation of the period T. (Exponential frequency modulation—see Figure 5.)

The application of these latter types of modulation will be discussed hereinafter.

Referring to Figures 3 and 7 it will be noted that the saw-tooth voltage has a very short "flyback time." One of the large contributions to this shortness is the peaking coil 17. The inductance of coil 17 is not critical but there is a minimum value at which the oscillator may refuse to oscillate.

The "flyback time" may be further reduced by placing several diodes 14 in parallel and this is understood to be within the inventive scope.

Figure 2:
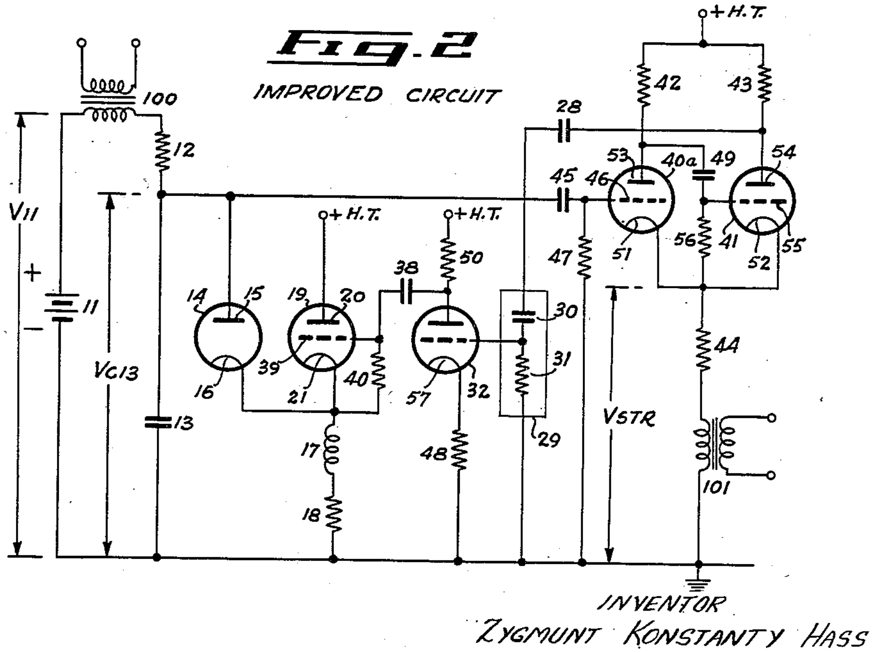
Figure 2 shows the basic circuit modified to raise the upper limit of frequency which may be generated.

In Figure 2 is shown a modification of the basic circuit so altered that the "flyback time" is further decreased and the upper limit of oscillator frequency further raised thereby.

In this embodiment the triode 22 is replaced by a "flip-flop" circuit the cumulative action of which is faster than that of the triode 22, thus further decreasing the "flyback time" of the oscillator.

To discuss the circuit of Figure 2 in detail it will be noted that the circuit includes a number of parts corresponding to those of Fig. 1 and identified by the same reference characters.

Triode 22 in Figure 1 is replaced in Figure 2 by two triodes 40*a* and 41 which have their plates 53 and 54 connected to a high tension source through respective resistances 42 and 43 and their cathodes connected to ground through a common resistance 44 and the secondary of transformer 101.

The anode 15 of diode 14 is connected through condenser 45 to the grid 46 of triode 40*a* while a grid leak is provided by resistance 47. The plate 53 of triode 40*a* is connected through a condenser 49 to the control grid 55 of triode 41. This control grid is connected to the common cathode junction through resistance 56.

The plate 53 is connected through isolating condenser 28 to the input of differentiating circuit 29. Respective cathodes 51 and 52 of triodes 40*a* and 41 are, as previously noted, connected together and to the resistance 44 and through the secondary of transformer 101 to ground.

Modulation transformer 100 between source 11 and resistance 12 and modulation source 101 between resistance 44 and ground are provided for the introduction of modulating signals as in Figure 1.

This circuit also includes a triode 32 having its cathode 57 connected through resistance 48 to ground, and having its grid connected to the differentiating circuit 31. The anode of this tube is connected through resistance 50 to the high tension source HT and through condenser 38 to the grid of tube 39.

The operation of this latter circuit is, in general, similar to that of the basic circuit. Consequently only the differences relating to the operation of the "flyback" circuit will be described in detail.

In this circuit the bias on triodes 40*a* and 41 is so adjusted that tube 41 is normally conducting. The resultant current through resistor 44 raises the potential of cathodes 52 and 51. Resistance 44 is selected so that this cathode potential is just below the cut-off potential for triode 40*a*.

As source 11 charges condenser 13, the grid 46 of triode 40*a* becomes more positive until it reaches a value sufficient to overcome the positive bias on cathode 51, the voltage difference of grid 46 and cathode 51 becoming less than the cut-off value so that triode 40 starts conducting.

As soon as tube 40*a* begins conducting there is an extremely fast transfer of plate current from the tube 41 to tube 40*a*. This speedy action is a result of the common cathode coupling of tubes 40*a* and 41 and the coupling of plate 53 to grid 55 by means of condenser 49.

This sudden decrease in plate current of tube 41 produces a positive transient pulse which is further sharpened by the differentiating circuit 29. Tube 32 amplifies and changes the polarity of the transient pulse from positive to negative.

This negative transient pulse cuts off the plate current of tube 19, causing cathode 21 of tube 19 and cathode 16 of tube 14 to drop in potential and thus allows condenser 13 to be discharged through diode 14. As the diode discharges the voltage on condenser 13 the grid 46 is lowered in potential and eventually cuts off current flow in triode 40*a*. As the potential on condenser 13 falls, it eventually reaches a level which will no longer sustain conduction in diode 14 so that current ceases to flow. Condenser 13 immediately commences charging, thus initiating another cycle. The cessation of current flow in diode 14 is the end of the "flyback" period. This period is shorter with the flip-flop circuit than in the circuit shown in Figure 1 where "flyback" action is initiated by the beginning of conduction in triode 22.

It will be noted that since current is normally flowing through triode 41 of Figure 2 of the flip-flop circuit, a polarizing bias $V_{STR}$ applied to cathode 51 of triode 40*a* controls the potential required on grid 46 to initiate conduction in triode 40*a*. This resistor 44 replaces the voltage source 27 in the circuit of Figure 1, and its resistance may be selected to give the desired value of $V_{STR}$.

Figure 8:
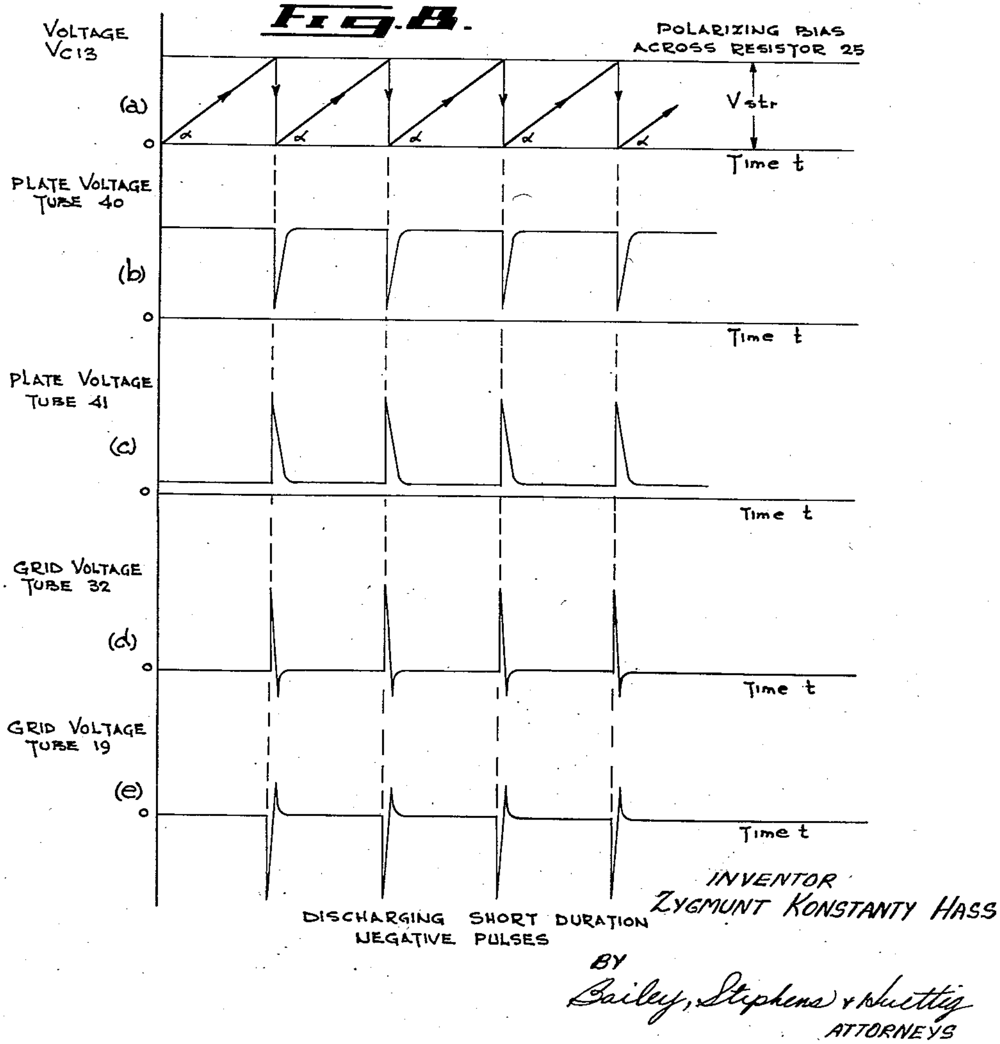
Figure 8 shows various wave forms developed in the circuit shown in Figure 2.

One complete cycle of operation of the modified circuit has been described above. Some of the wave forms have been shown in Figure 8 in which (with time being the abscissa on all graphs):

Graph (*a*) is a curve showing the voltage across the condenser plotted as the ordinate,
Graph (*b*) has as ordinate the plate voltage of tube 40*a*,
Graph (*c*) has as ordinate the plate voltage of tube 41,
Graph (*d*) has as ordinate the grid voltage of tube 32,
Graph (*d*) has as ordinate the grid voltage of tube 19.

Through graphs vertical dotted lines are drawn to indicate the same time instants on all curves.

Referring to graph (*a*) it will be seen that the slope of the charging portion is controlled by the magnitude of source 11 while the striking voltage $V_{STR}$ value is set by the resistance of resistor 44. The modulation of the oscillator may be achieved in the same way as described with reference to Figure 1 and the comments, therefore, may be applied to this circuit.

Figures 9, 10:
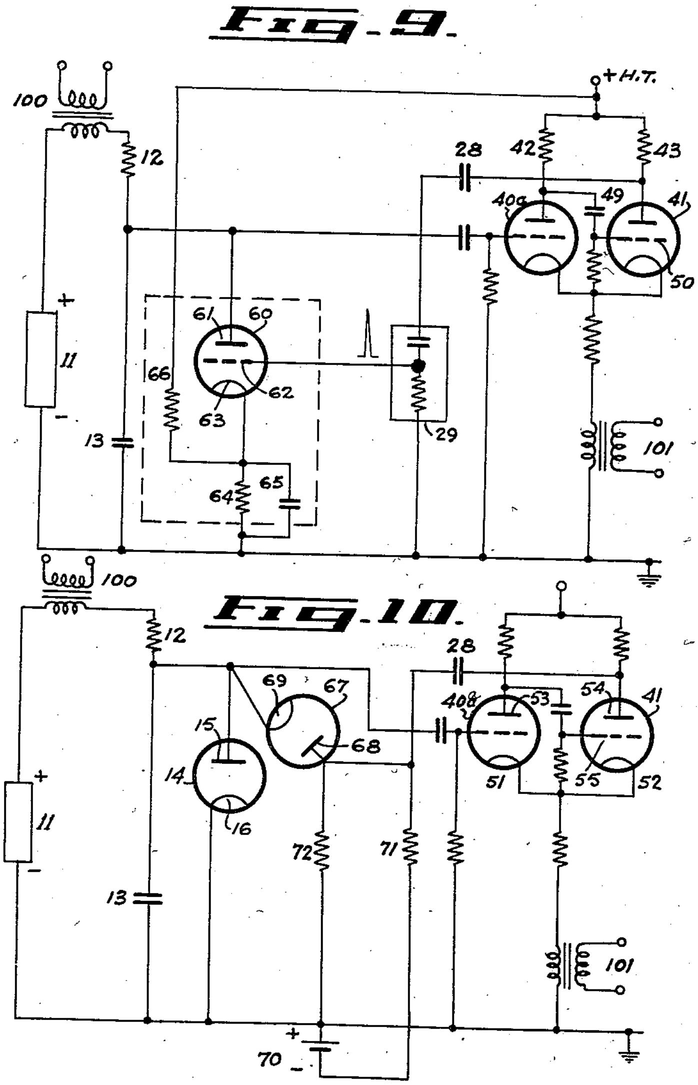
Figure 9 shows another alternate form of the invention.
Figure 10 shows a further alternate form.

In Figure 9 is a variation of the circuit in Figure 2. A triode or multi-electrode tube 60 replaces the discharging circuit ( i. e. amplifier 32, cathode follower 19 and diode 14 in Figure 2).

Tube 60 is normally biased beyond cut-off. The necessary bias for cathode 63 is derived from the HT voltage divider composed of resistor 66 and resistor 64.

The positive transient pulse from the differentiating circuit 29 is applied to grid 62 of tube 60; tube 60 begins conducting, and condenser 13 discharges.

In Figure 10 is shown a variation of the circuit of Figure 9, wherein the discharge tube 60 of Figure 9 is replaced by diodes 14 and 67.

As shown, the plate of triode 41 is connected through condenser 28 to the anode 68 of a diode 67. The cathode 69 of this diode is connected to the junction point of the low potential end of resistor 12, the high potential side of condenser 13 and the anode 15 of diode 14.

The anode 68 is connected to a closed circuit composed of source potential 70, resistor 71 and resistor 72. The negative side of source 70 is connected to resistor 71 and the positive side is grounded. The anode 68 of diode 67 is connected to the junction of resistors 71 and 72. It is seen that a negative bias is thus applied to the anode 68 of diode 67.

Since diodes 14 and 67 are series-connected, thus negative potential is shared by both diodes.

The operation of the circuit is as follows: Source 11 charges condenser 13 and the grid potential of triode 40*a* rises. Tube 40*a* begins conducting and a negative transient pulse which appears at plate 53 is applied to grid 55 of tube 41. The positive transient pulse at plate 54 of tube 41 is of sufficient magnitude to overcome the negative bias on diodes 67 and 14. Hence both diodes conduct and condenser 13 discharges. The potential of grid 46 of tube 40*a* drops to beyond cut-off value and the flip-flop circuit is restored to its original condition.

The circuit of Figure 10 represents the simplest form of components which are essential for operation. If a sharper pulse were required at the plate 68 of diode 67 a differentiating circuit 29 may be inserted. Similarly, if the magnitude of the differentiated pulse was not sufficiently large, an amplifier could be inserted here, provided the polarity of the pulse applied to plate 68 of diode 67 remains unchanged. The circuits shown in Figures 1, 2 and 10 may be improved by replacing the electron diodes with germanium crystal diodes.

I claim:

1. In a radio frequency relaxation oscillator comprising a main condenser and a source of direct-current charging potential connected to said condenser, the provision of: a first triode, the grid and cathode of which are arranged in a series circuit comprising said main condenser, the positive side of said main condenser being connected to said grid; means for biasing the grid of said first triode negative in relation to the cathode of said triode; a diode connected across said condenser with its anode connected to the positive side of said condenser; means for providing a positive bias on the cathode of said diode relative to the negative side of said condenser, said means including a bias resistance connected between a source of positive potential and the negative side of said condenser; means for removing the positive bias on the cathode of said diode, which comprises a second triode series connected between said bias resistance and said source of positive potential, and having its grid connected to the anode of said first triode; means for applying a modulating frequency potential to said first triode; and a differentiating circuit connected between the anode of said first triode and the grid of said second triode.

2. Apparatus as claimed in claim 1 wherein said differentiating circuit comprising a series circuit extending from the anode of said first triode through a condenser and a resistance to the negative side of said main condenser, the grid of said second triode being connected to the junction between said series circuit condenser and said series circuit resistance.

3. In a radio frequency relaxation oscillator comprising a main condenser and a source of direct-current charging potential connected to said condenser, the provision of: discharge means including a triode the grid and cathode of which are arranged in a series circuit comprising said main condenser, the positive side of said main condenser being connected to said grid, and means for biasing said grid negatively in relation to said cathode; a diode connected across said condenser with its anode connected to the positive side of said condenser; means for biasing the cathode of said diode positive with respect to the negative side of said condenser; means for removing said positive bias, operable in response to a negative-going pulse appearing on the anode of said triode upon the application to the grid thereof of a positive going potential of sufficient value to overcome said grid bias; and means for applying a modulation-frequency potential, comprising a transformer the secondary of which is connected in series with the grid and cathode of said triode.

References Cited in the file of this patent

UNITED STATES PATENTS

| | | |
|---|---|---|
| 2,155,210 | Young | Apr. 18, 1939 |
| 2,269,417 | Crosby | Jan. 5, 1942 |
| 2,449,923 | Anderson | Sept. 21, 1948 |
| 2,492,161 | Levy | Dec. 27, 1949 |
| 2,602,896 | Whitaker | July 8, 1952 |
| 2,627,576 | Howarth | Feb. 3, 1953 |
| 2,642,532 | Mofenson | June 16, 1953 |

FOREIGN PATENTS

| | | |
|---|---|---|
| 534,774 | Great Britain | Mar. 18, 1941 |